(12) United States Patent
Yen

(10) Patent No.: US 11,927,625 B2
(45) Date of Patent: Mar. 12, 2024

(54) ANALYSIS METHOD AND ANALYSIS SYSTEM OF VOLTAGE CONTRAST DEFECT

(71) Applicant: Powerchip Semiconductor Manufacturing Corporation, Hsinchu (TW)

(72) Inventor: Yue-Ying Yen, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 737 days.

(21) Appl. No.: 17/092,324

(22) Filed: Nov. 9, 2020

(65) Prior Publication Data

US 2022/0043054 A1     Feb. 10, 2022

(30) Foreign Application Priority Data

Aug. 5, 2020  (TW) .................................. 109126588

(51) Int. Cl.
*G01R 31/307* (2006.01)
*G06T 7/00* (2017.01)
(Continued)

(52) U.S. Cl.
CPC ............ *G01R 31/307* (2013.01); *G06T 7/001* (2013.01); *H01J 37/222* (2013.01); *H01J 37/28* (2013.01);
(Continued)

(58) Field of Classification Search
CPC .................. G01R 31/307; G06T 7/001; G06T 2207/30148; H01J 37/222; H01J 37/28; H01J 2237/24564; H01J 2237/2817
See application file for complete search history.

(56) References Cited

U.S. PATENT DOCUMENTS

| 7,443,189 B2 | 10/2008 | Ramappa |
| 2007/0181808 A1* | 8/2007 | Murakoshi .............. H01J 37/29 250/310 |

(Continued)

FOREIGN PATENT DOCUMENTS

| CN | 107533103 | 1/2018 |
| TW | 200945469 | 11/2009 |
| TW | 202013082 | 4/2020 |

OTHER PUBLICATIONS

Office Action of Taiwan Counterpart Application, dated Apr. 12, 2021, pp. 1-7, 109126588.

(Continued)

*Primary Examiner* — Paresh Patel
(74) *Attorney, Agent, or Firm* — JCIPRNET

(57) ABSTRACT

A voltage contrast defect analysis method including the following steps is provided. A voltage contrast defect detection is performed on a die to be tested by using an electron beam inspection machine to find out a defect address of a voltage contrast defect. A first scanning electron microscope image at the defect address of the die to be tested is obtained by using a scanning electron microscope. A first critical dimension of the first scanning electron microscope image at the defect address of the die to be tested is measured. The first critical dimension on the die to be tested is compared with a corresponding second critical dimension on a reference die where no voltage contrast defect occurs at the defect address to determine whether the first critical dimension and the second critical dimension are the same.

18 Claims, 2 Drawing Sheets

(51) Int. Cl.
*H01J 37/22* (2006.01)
*H01J 37/28* (2006.01)
*H01L 21/66* (2006.01)

(52) U.S. Cl.
CPC .............. *H01L 22/12* (2013.01); *H01L 22/34* (2013.01); *G06T 2207/30148* (2013.01); *H01J 2237/24564* (2013.01); *H01J 2237/2817* (2013.01)

(56) References Cited

U.S. PATENT DOCUMENTS

| | | | | |
|---|---|---|---|---|
| 2008/0267489 | A1* | 10/2008 | Xiao | G06T 7/001 |
| | | | | 382/147 |
| 2016/0341791 | A1* | 11/2016 | Duffy | G01R 31/305 |
| 2022/0005170 | A1* | 1/2022 | Yen | G06T 7/001 |

OTHER PUBLICATIONS

Fuming Wang et al., "Assessment of local variability by high-throughput e-beam metrology for prediction of patterning defect probabilities", SPIE Advanced Lithography, Mar. 2018, pp. 1-9.

Seo Min Kim et al., "EUV stochastic noise analysis and LCDU mitigation by etching on dense contact-hole array patterns", SPIE Advanced Lithography, Apr. 2014, pp. 1-10.

T.R.Cass et al., "Application of the SEMSpec electron-beam inspection system to in-process defect detection on semiconductor wafers", Microelectronic Engineering, Jan. 1996, pp. 567-570.

JEOL Ltd., "A Guide to Scanning Microscope Observation", retrieved on Nov. 5, 2020, pp. 1-35.

* cited by examiner

ANALYSIS METHOD AND ANALYSIS SYSTEM OF VOLTAGE CONTRAST DEFECT

CROSS-REFERENCE TO RELATED APPLICATION

This application claims the priority benefit of Taiwan application no. 109126588, filed on Aug. 5, 2020. The entirety of the above-mentioned patent application is hereby incorporated by reference herein and made a part of this specification.

BACKGROUND OF THE INVENTION

Field of the Invention

The invention relates to a defect analysis method and a defect analysis system, and particularly relates to a voltage contrast defect analysis method and a voltage contrast defect analysis system.

Description of Related Art

In the defect detection technology of semiconductor devices, a voltage contrast method using electron beams for defect detection has been developed. In addition, the voltage contrast defect found by the voltage contrast method will be further analyzed to find out the cause of the voltage contrast defect. The voltage contrast defect is sometimes related to the critical dimension uniformity (CDU). The current common inspection method is to inspect the CDU by an electron beam inspection. However, due to the small inspection coverage (typically less than 1%) of electron beam inspection for the CDU, the correlation between the voltage contrast defect and the CDU is low, and the reliability of defect analysis is reduced.

SUMMARY OF THE INVENTION

The invention provides a voltage contrast defect analysis method and a voltage contrast defect analysis system, which can improve the reliability of defect analysis.

The invention provides a voltage contrast defect analysis method, which includes the following steps. A voltage contrast defect detection is performed on a die to be tested by using an electron beam inspection (EBI) machine to find out a defect address of a voltage contrast defect. A first scanning electron microscope image at the defect address of the die to be tested is obtained by using a scanning electron microscope (SEM). A first critical dimension of the first SEM image at the defect address of the die to be tested is measured. The first critical dimension on the die to be tested is compared with a corresponding second critical dimension on a reference die where no voltage contrast defect occurs at the defect address to determine whether the first critical dimension and the second critical dimension are the same.

According to an embodiment of the invention, in the voltage contrast defect analysis method, the die to be tested and the reference die are derived from the same wafer.

According to an embodiment of the invention, in the voltage contrast defect analysis method, an inspection coverage of the voltage contrast defect detection may be 5% to 100% of a device region to be tested on the die to be tested.

According to an embodiment of the invention, in the voltage contrast defect analysis method, the device region to be tested is, for example, a memory region or a test key region.

According to an embodiment of the invention, in the voltage contrast defect analysis method, the voltage contrast defect detection may include the following steps. The die to be tested is scanned by using the EBI machine to obtain an EBI image. The defect address in the EBI image is found out according to a gray level value of the EBI image.

According to an embodiment of the invention, the voltage contrast defect analysis method may further include the following steps. Before the first SEM image is obtained, a second SEM image at the defect address of the die to be tested is obtained by using the SEM. The image quality of the first SEM image may be higher than the image quality of the second SEM image. Determine whether there is a physical defect according to the second SEM image.

According to an embodiment of the invention, the voltage contrast defect analysis method may further include the following steps. Determine whether there is a physical defect according to the first SEM image.

According to an embodiment of the invention, the voltage contrast defect analysis method may further include the following steps. A defect classification is performed according to a structure corresponding to the voltage contrast defect.

According to an embodiment of the invention, in the voltage contrast defect analysis method, after the defect classification is performed, the first SEM image of the die to be tested in each defect type obtained after the defect classification may be obtained by using the SEM.

According to an embodiment of the invention, in the voltage contrast defect analysis method, the method of obtaining the second critical dimension on the reference die may include the following steps. A third SEM image of the reference die corresponding to the defect address of the die to be tested is obtained by using the SEM. The second critical dimension on the third SEM image is measured.

The invention provides a voltage contrast defect analysis system, which includes an EBI machine, a SEM, and an electronic apparatus. The EBI machine is configured to perform a voltage contrast defect detection on a die to be tested to find out a defect address of a voltage contrast defect. The SEM is configured to obtain a first SEM image at the defect address of the die to be tested. The electronic apparatus coupled to the EBI machine and the SEM. The electronic apparatus includes a memory and a processor. The memory is configured to store modules. The processor is coupled to the memory. The processor is configured to read and execute the modules to perform following operations. The processor measures a first critical dimension of the first SEM image at the defect address of the die to be tested. The processor compares the first critical dimension on the die to be tested with a corresponding second critical dimension on a reference die where no voltage contrast defect occurs at the defect address to determine whether the first critical dimension and the second critical dimension are the same.

According to an embodiment of the invention, in the voltage contrast defect analysis system, the die to be tested and the reference die are derived from the same wafer.

According to an embodiment of the invention, in the voltage contrast defect analysis system, an inspection coverage of the voltage contrast defect detection may be 5% to 100% of a device region to be tested on the die to be tested.

According to an embodiment of the invention, in the voltage contrast defect analysis system, the device region to be tested is, for example, a memory region or a test key region.

According to an embodiment of the invention, in the voltage contrast defect analysis system, the EBI machine may be configured to scan the die to be tested to obtain an EBI image. The processor may find out the defect address in the EBI image according to a gray level value of the EBI image.

According to an embodiment of the invention, in the voltage contrast defect analysis system, the SEM may be configured to obtain a second SEM image at the defect address of the die to be tested. The image quality of the first SEM image may be higher than the image quality of the second SEM image. The processor may determine whether there is a physical defect according to the second SEM image.

According to an embodiment of the invention, in the voltage contrast defect analysis system, the processor may determine whether there is a physical defect according to the first SEM image.

According to an embodiment of the invention, in the voltage contrast defect analysis system, the processor may perform a defect classification according to a structure corresponding to the voltage contrast defect.

According to an embodiment of the invention, in the voltage contrast defect analysis system, the SEM may be configured to obtain the first SEM image of the die to be tested in each defect type obtained after the defect classification.

According to an embodiment of the invention, in the voltage contrast defect analysis system, the SEM may be configured to obtain a third SEM image of the reference die corresponding to the defect address of the die to be tested. The processor may measure the second critical dimension on the third SEM image.

Based on the above description, in the voltage contrast defect analysis method and the voltage contrast defect analysis, after the defect address of the voltage contrast defect of the die to be tested is found out by the EBI machine, the first SEM image at the defect address of the die to be tested is obtained, then the first critical dimension of the first SEM image at the defect address of the die to be tested is compared with the corresponding second critical dimension on the reference die where no voltage contrast defect occurs at the defect address to determine whether the first critical dimension and the second critical dimension are the same. In this way, it can be determined whether the voltage contrast defect of the die to be tested is caused by poor CDU. In addition, since the first SEM image is obtained at the defect address of the voltage contrast defect of the die to be tested, the correlation between the voltage contrast defect and the CDU can be increased, thereby increasing the reliability of the defect analysis. Furthermore, the voltage contrast defect analysis method can be automatically executed by the EBI machine, the SEM, and the electronic apparatus in the voltage contrast defect analysis system, so that the automated analysis method and the automated analysis system can be constructed.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
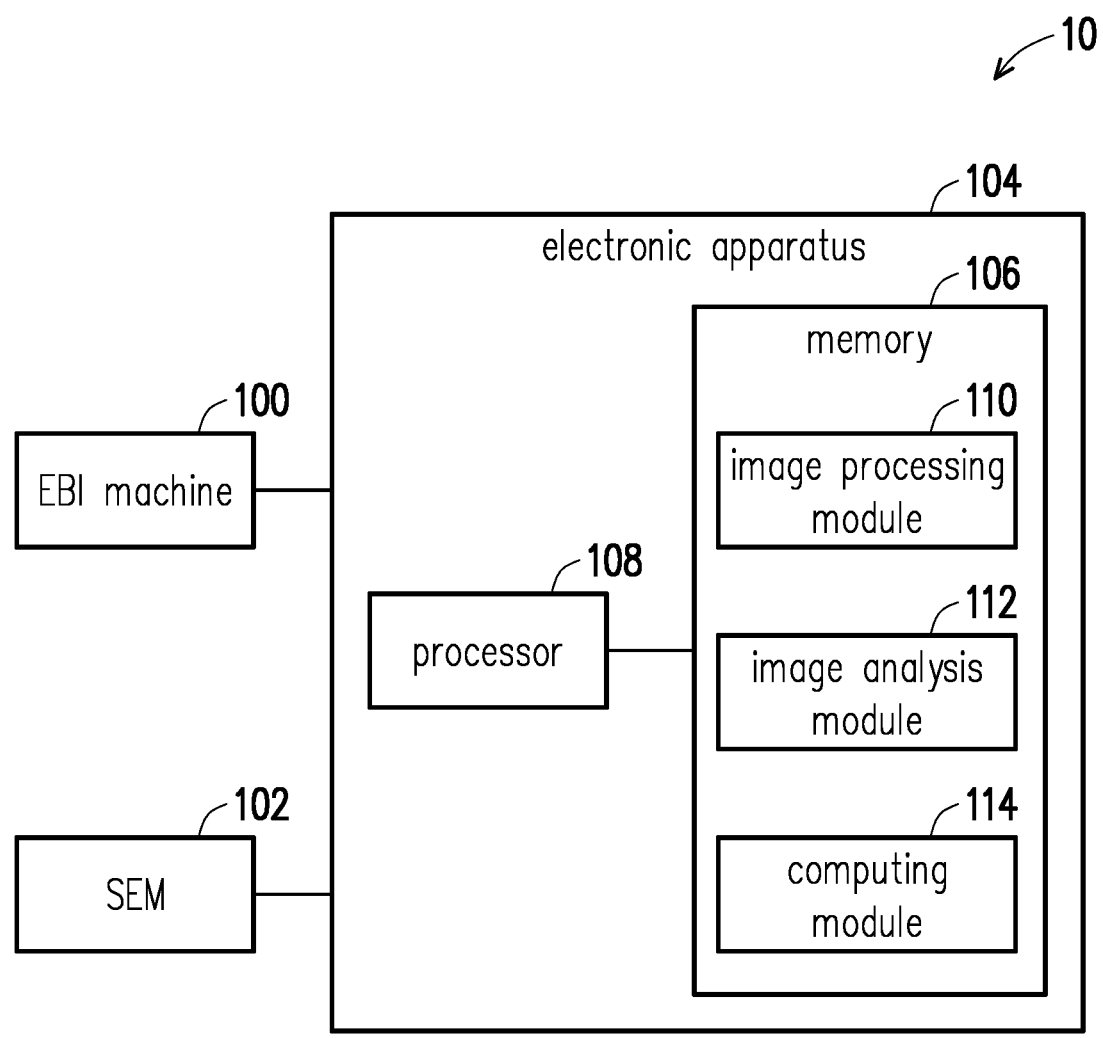
FIG. 1 is a schematic diagram of a voltage contrast defect analysis system according to an embodiment of the invention.

FIG. 1 is a schematic diagram of a voltage contrast defect analysis system according to an embodiment of the invention.

Referring to FIG. 1, a voltage contrast defect analysis system 10 includes an EBI machine 100, a SEM 102 and an electronic apparatus 104. The EBI machine 100 can perform a die inspection on a die on a wafer to obtain an EBI image corresponding to the die, and provide the EBI image to the electronic apparatus 104 for image processing and analysis. In the present embodiment, the EBI machine 100 may be configured to perform a voltage contrast defect detection on a die to be tested to find out a defect address of a voltage contrast defect.

The SEM 102 can perform a die detection on a die on a wafer to obtain a SEM image corresponding to the die, and provide the SEM image to the electronic apparatus 104 for image processing and analysis. The wafer may include memory dies, such as static random access memory (SRAM) dies, but the inspection object of the invention is not limited thereto. In the present embodiment, the SEM 102 may be configured to obtain a SEM image at the defect address of the die to be tested.

The electronic apparatus 104 is coupled to the EBI machine 100 and the SEM 102. The electronic apparatus 104 may be a computer apparatus. The electronic apparatus 104 includes a memory 106 and a processor 108. The memory 106 is configured to store modules, wherein the modules may include an image processing module 110, an image analysis module 112, and a calculation module 114. The memory 106 may be used to store images and modules or software for the processor 108 to access and execute, so as to implement the related methods and the voltage contrast defect analysis method described in the embodiments of the invention.

The processor 108 is coupled to the memory 106. The processor 108 may be configured to read and execute the modules (for example, the image processing module 110, the image analysis module 112, and the calculation module 114) to perform the following operations. The processor 108 measures a critical dimension CD1 of the SEM image at the defect address of the die to be tested. The processor 108 compares the critical dimension CD1 on the die to be tested with a corresponding critical dimension CD2 on a reference die where no voltage contrast defect occurs at the defect address to determine whether the critical dimension CD1 and the critical dimension CD2 are the same. In this way, it can be determined whether the voltage contrast defect of the die to be tested is caused by poor CDU. However, the processor 108 of the invention is not limited to execute the aforementioned modules. In some embodiments, the processor 108 may also implement the aforementioned image processing and/or analysis by executing related programs or through corresponding hardware circuits.

In the present embodiment, the processor 108 may be a graphics processing unit (GPU), an image signal processor (ISP), a central processing unit (CPU), or other programmable general-purpose or special-purpose microprocessor, a digital signal processor (DSP), a programmable controller, application specific integrated circuits (ASIC), a programmable logic device (PLD), other similar processors or a combination of the processor circuits.

Figure 2:
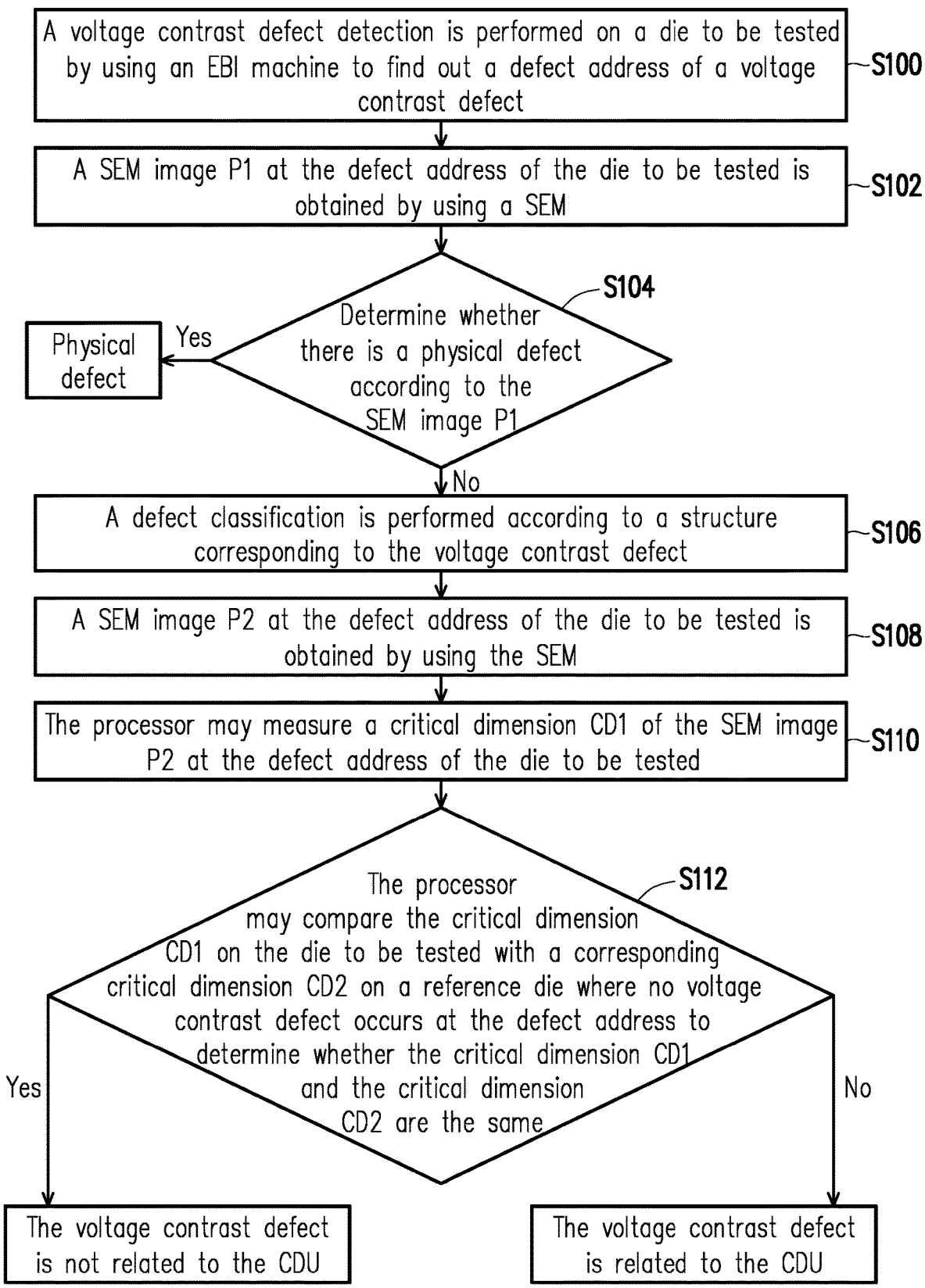
FIG. 2 is a flowchart of a voltage contrast defect analysis method according to an embodiment of the invention.

FIG. 2 is a flowchart of a voltage contrast defect analysis method according to an embodiment of the invention.

In the present embodiment, the voltage contrast defect analysis system 10 and the voltage contrast defect analysis method can be used to determine whether the voltage contrast defect of the die to be tested is caused by poor CDU. In some embodiments, the voltage contrast defect analysis system 10 and the voltage contrast defect analysis method can be used to determine whether the voltage contrast defect of the die to be tested is caused by poor CDU of the contact (e.g., the critical dimension of contact is unstable). In some embodiments, the voltage contrast defect analysis system 10 and the voltage contrast defect analysis method can be used to determine whether the voltage contrast defect of the die to be tested is caused by poor CDU of metal silicide (e.g., nickel silicide (NiSi)) (e.g., incomplete formation of metal silicide).

Referring to FIG. 1 and FIG. 2, a step S100 is performed, a voltage contrast defect detection is performed on a die to be tested by using an EBI machine 100 to find out a defect address of a voltage contrast defect. The voltage contrast defect detection may include the following steps. The die to be tested is scanned by using the EBI machine 100 to obtain an EBI image. The processor 108 may find out the defect address in the EBI image according to a gray level value of the EBI image. The defect address of the voltage contrast defect may be an address where a dark voltage contrast (DVC) occurs or an address where a bright voltage contrast (BVC) occurs. In addition, the inspection coverage of the voltage contrast defect detection may be 5% to 100% of the device region to be tested on the die to be tested. The device region to be tested is, for example, a memory region (e.g., a SRAM region) or a test key region. The die to be tested may be a memory die. In the present embodiment, the die to be tested is, for example, an SRAM die, but the invention is not limited thereto.

A step S102 may be performed, a SEM image P1 at the defect address of the die to be tested is obtained by using a SEM 102.

A step S104 may be performed, the processor 108 may determine whether there is a physical defect according to the SEM image P1. If the determination result is "Yes", it can be determined that the voltage contrast defect is caused by the physical defect. If the determination result is "No", it can be determined that the voltage contrast defect is not related to the physical defect. The physical defect is, for example, a particle or a residue.

A step S106 may be performed, the processor 108 may perform a defect classification according to a structure corresponding to the voltage contrast defect. The processor 108 may use the EBI image obtained in the step S100 to perform the defect classification. In this way, when the electronic apparatus 104 is subsequently used for the voltage contrast defect analysis, one of the dies of each defect type may be selected as a representative, and there is no need to detect the die of the repeated defect type, thereby improving the overall throughput.

In some embodiments, taking the SRAM die as an example, the structure corresponding to the defect type may be a bit line structure, a word line, a share contact structure, an inverter transmitting terminal (Q, Q bar) structure, a ground (Vss) terminal structure, an operating voltage (Vdd) terminal structure, or other parts having a structural defect and having a specific relative position relationship or a specific ratio relationship between a metal material and the oxide layer in the SRAM.

Furthermore, the step S102, the step S104, and the step S106 are optional steps. In some embodiments, after the step S100 is performed, the step S102 and the step S104 may be omitted, and the step S106 may be performed directly. In other embodiments, after the step S100 is performed, the step S102, the step S104, and the step S106 may be omitted, and the step S108 may be performed directly.

A step S108 is performed, a SEM image P2 at the defect address of the die to be tested is obtained by using the SEM 102. The image quality of the SEM image P2 may be higher than the image quality of the SEM image P1. In the case that the step S106 is performed, the SEM image P2 of the die to be tested in each defect type obtained after the defect classification may be obtained by using the SEM 102.

In some embodiments, in the case that the step S102 and the step S104 are not performed, the processor 108 may determine whether there is a physical defect according to the SEM image P2.

A step S110 is performed, the processor 108 may measure a critical dimension CD1 of the SEM image P2 at the defect address of the die to be tested.

A step S112 is performed, the processor 108 may compare the critical dimension CD1 on the die to be tested with a corresponding critical dimension CD2 on a reference die where no voltage contrast defect occurs at the defect address to determine whether the critical dimension CD1 and the critical dimension CD2 are the same. If the determination result is "Yes", it can be determined that the voltage contrast defect is not related to the CDU, and other tests can be performed to find out the cause of the voltage contrast defect. If the determination result is "No", it can be determined that the voltage contrast defect is related to the CDU, that is, the voltage contrast defect of the die to be tested is caused by poor CDU. The term "the same" described here refers to "substantially the same", that is, there may be a tolerable error. The critical dimension CD2 is the critical dimension measured at the address of the reference die corresponding to the defect address of the die to be tested. In the present embodiment, the die to be tested and the reference die are derived from the same wafer, and the number of the selected reference dies may be one or more.

Moreover, the method of obtaining the critical dimension CD2 on the reference die may include the following steps. A SEM image P3 of the reference die corresponding to the defect address of the die to be tested is obtained by using the SEM 102. The processor 108 may measure the critical dimension CD2 on the SEM image P3.

Based on the above embodiments, in the voltage contrast defect analysis method and the voltage contrast defect analysis system 10, after the defect address of the voltage contrast defect of the die to be tested is found out by the EBI machine 100, the SEM image P2 at the defect address of the die to be tested is obtained, then the critical dimension CD1 of the SEM image P2 at the defect address of the die to be tested is compared with a corresponding critical dimension CD2 on the reference die where no voltage contrast defect occurs at the defect address to determine whether the critical dimension CD1 and the critical dimension CD2 are the same. In this way, it can be determined whether the voltage contrast defect of the die to be tested is caused by poor CDU. In addition, since the SEM image P2 is obtained from the defect address of the voltage contrast defect of the die to be tested, the correlation between the voltage contrast defect and the CDU can be increased, thereby increasing the reliability of the defect analysis. Furthermore, the voltage contrast defect analysis method can be automatically executed by the EBI machine 100, the SEM 102, and the electronic apparatus 104 in the voltage contrast defect analysis system 10, so that the automated analysis method and the automated analysis system can be constructed.

In summary, the voltage contrast defect analysis method and the voltage contrast defect analysis system of the above embodiments can automatically determine whether the voltage contrast defect of the die to be tested is caused by poor CDU, and can increase the correlation between the voltage contrast defect and the CDU and the reliability of the defect analysis.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A voltage contrast defect analysis method, comprising:
    performing a voltage contrast defect detection on a die to be tested by using an electron beam inspection machine to find out a defect address of a voltage contrast defect;
    obtaining a first scanning electron microscope image at the defect address of the die to be tested by using a scanning electron microscope;
    measuring a first critical dimension of the first scanning electron microscope image at the defect address of the die to be tested;
    comparing the first critical dimension on the die to be tested with a corresponding second critical dimension on a reference die where no voltage contrast defect occurs at the defect address to determine whether the first critical dimension and the second critical dimension are the same;
    before obtaining the first scanning electron microscope image, obtaining a second scanning electron microscope image at the defect address of the die to be tested by using the scanning electron microscope, wherein an image quality of the first scanning electron microscope image is higher than an image quality of the second scanning electron microscope image; and
    determining whether there is a physical defect according to the second scanning electron microscope image.

2. The voltage contrast defect analysis method according to claim 1, wherein the die to be tested and the reference die are derived from the same wafer.

3. The voltage contrast defect analysis method according to claim 1, wherein an inspection coverage of the voltage contrast defect detection is 5% to 100% of a device region to be tested on the die to be tested.

4. The voltage contrast defect analysis method according to claim 3, wherein the device region to be tested comprises a memory region or a test key region.

5. The voltage contrast defect analysis method according to claim 1, wherein the voltage contrast defect detection comprises:
    scanning the die to be tested by using the electron beam inspection machine to obtain an electron beam inspection image; and
    finding out the defect address in the electron beam inspection image according to a gray level value of the electron beam inspection image.

6. The voltage contrast defect analysis method according to claim 1, further comprising:
    determining whether there is a physical defect according to the first scanning electron microscope image.

7. The voltage contrast defect analysis method according to claim 1, further comprising:
    performing a defect classification according to a structure corresponding to the voltage contrast defect.

8. The voltage contrast defect analysis method according to claim 7, wherein
    after the defect classification is performed, the first scanning electron microscope image of the die to be tested in each defect type obtained after the defect classification is obtained by using the scanning electron microscope.

9. The voltage contrast defect analysis method according to claim 1, wherein a method of obtaining the second critical dimension on the reference die comprises:
    obtaining a third scanning electron microscope image of the reference die corresponding to the defect address of the die to be tested by using the scanning electron microscope; and
    measuring the second critical dimension on the third scanning electron microscope image.

10. A voltage contrast defect analysis system, comprising:
    an electron beam inspection machine configured to perform a voltage contrast defect detection on a die to be tested to find out a defect address of a voltage contrast defect;
    a scanning electron microscope configured to obtain a first scanning electron microscope image at the defect address of the die to be tested; and
    an electronic apparatus coupled to the electron beam inspection machine and the scanning electron microscope, and comprising:
        a memory configured to store modules; and
        a processor coupled to the memory, wherein the processor is configured to read and execute the modules to perform following operations,
        wherein the processor measures a first critical dimension of the first scanning electron microscope image at the defect address of the die to be tested,
        wherein the processor compares the first critical dimension on the die to be tested with a corresponding second critical dimension on a reference die where no voltage contrast defect occurs at the defect address to determine whether the first critical dimension and the second critical dimension are the same, and
        wherein the scanning electron microscope is configured to obtain a second scanning electron microscope image at the defect address of the die to be tested, an image quality of the first scanning electron microscope image is higher than an image quality of the second scanning electron microscope image, and
        the processor determines whether there is a physical defect according to the second scanning electron microscope image.

11. The voltage contrast defect analysis system according to claim 10, wherein the die to be tested and the reference die are derived from the same wafer.

12. The voltage contrast defect analysis system according to claim 10, wherein an inspection coverage of the voltage contrast defect detection is 5% to 100% of a device region to be tested on the die to be tested.

13. The voltage contrast defect analysis system according to claim 12, wherein the device region to be tested comprises a memory region or a test key region.

14. The voltage contrast defect analysis system according to claim 10, wherein
the electron beam inspection machine is configured to scan the die to be tested to obtain an electron beam inspection image, and
the processor finds out the defect address in the electron beam inspection image according to a gray level value of the electron beam inspection image.

15. The voltage contrast defect analysis system according to claim 10, wherein the processor determines whether there is a physical defect according to the first scanning electron microscope image.

16. The voltage contrast defect analysis system according to claim 10, wherein the processor performs a defect classification according to a structure corresponding to the voltage contrast defect.

17. The voltage contrast defect analysis system according to claim 16, the scanning electron microscope is configured to obtain the first scanning electron microscope image of the die to be tested in each defect type obtained after the defect classification.

18. The voltage contrast defect analysis system according to claim 10, wherein
the scanning electron microscope is configured to obtain a third scanning electron microscope image of the reference die corresponding to the defect address of the die to be tested, and
the processor measures the second critical dimension on the third scanning electron microscope image.

* * * * *